(12) United States Patent
Xiong

(10) Patent No.: US 7,238,567 B2
(45) Date of Patent: Jul. 3, 2007

(54) SYSTEM AND METHOD FOR INTEGRATING LOW SCHOTTKY BARRIER METAL SOURCE/DRAIN

(75) Inventor: Weize Xiong, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 258 days.

(21) Appl. No.: 10/924,079

(22) Filed: Aug. 23, 2004

(65) Prior Publication Data

US 2006/0040430 A1 Feb. 23, 2006

(51) Int. Cl.
*H01L 21/8242* (2006.01)

(52) U.S. Cl. .............. 438/240; 257/69; 257/E21.632; 438/199

(58) Field of Classification Search ........... 257/69, 257/E21.632; 438/199, 240
See application file for complete search history.

(56) References Cited

U.S. PATENT DOCUMENTS

| 5,374,564 | A | | 12/1994 | Bruel |
|---|---|---|---|---|
| 5,461,243 | A | * | 10/1995 | Ek et al. ............. 257/190 |
| 6,451,641 | B1 | * | 9/2002 | Halliyal et al. ......... 438/200 |
| 6,909,186 | B2 | * | 6/2005 | Chu .................. 257/751 |
| 2005/0045969 | A1 | * | 3/2005 | Lee et al. ............. 257/410 |
| 2005/0093033 | A1 | * | 5/2005 | Kinoshita et al. ........ 257/288 |
| 2005/0104152 | A1 | * | 5/2005 | Snyder et al. ........... 257/471 |
| 2005/0112857 | A1 | * | 5/2005 | Gluschenkov et al. ..... 438/585 |

OTHER PUBLICATIONS

Guo, J., et al., "*A Computational Study of Thin-Body, Double-Gate, Schottky Barrier MOSFETs*", IEEE Transactions on Electron Devices, vol. 49, No. 11, (6 pages), Nov. 2002.

Lin, Homg-Chih, "*High-Performance P-Channel Schottky-Barrier SOI FinFET Featuring Self-Aligned PtSi Source/Drain and Electrical Junctions*", IEEE Electron Device Letters, vol. 24, No. 2, (3 pages), Feb. 2003.

Jang, et al., "*Simulation Of Schottky Barrier Tunnel Transistor Using Simple Boundary Condition*", Applied Physics Letters, vol. 82, No. 16, 2003 American Institute of Physics, pp. 2718-2720, Apr. 2003.

Connelly et al., "*Performance Advantage of Schottky Source/Drain in Ultrathin-Body Silicon-on-Insulator and Dual-Gate CMOS*", IEEE Transactions on Electron Devices, vol. 50, No. 5, (6 pages), May 2003.

Kinoshita, et al., "*Solution for High-Performance Schottky-Source/Drain MOSFETs: Schottky Barrier Height Engineering with Dopant Segregation Techniques*", 2004 Symposium on VLSI Technology, Digest of Technical Papers, Advanced LSI Technology Laboratory, Corporate R&D Center, Toshiba Corporation, pp. 168-169, 2004.

* cited by examiner

*Primary Examiner*—Asok Kumar Sarkar
(74) *Attorney, Agent, or Firm*—Peter K. McLarty; W. James Brady, III; Frederick J. Telecky, Jr.

(57) ABSTRACT

According to one embodiment of the invention, a method for integrating low Schottky barrier metal source/drain includes providing a substrate, forming an epitaxial SiGe layer outwardly from the substrate, forming an epitaxial Si layer outwardly from the SiGe layer, and forming a metal source and a metal drain.

13 Claims, 2 Drawing Sheets

SYSTEM AND METHOD FOR INTEGRATING LOW SCHOTTKY BARRIER METAL SOURCE/DRAIN

TECHNICAL FIELD OF THE INVENTION

The present invention relates generally to the field of semiconductor devices and, more particularly, to a system and method for integrating low Schottky barrier metal source/drain.

BACKGROUND OF THE INVENTION

Semiconductor manufacturers have recently been experimenting with metal source/drain MOSFETs. Metal source/drain offers lower sheet resistance than doped silicon, possesses infinite abruptness, and exhibits low contact resistance. In addition, there is no issue with random doping effect from source/drain to the channel. Lower cost due to the elimination of implanters and fancy annealing tools is also a driver.

However, for metal source/drain to work, the Schottky barrier height between the metal and conducting channel in the silicon should be close to zero for acceptable drive current. No such metals or metal silicides currently exist to achieve this. Currently, ErSi and PtSi have the lowest barrier height, but the barrier height is still greater than 0.15 eV, which is too high for metal source/drain.

SUMMARY OF THE INVENTION

According to one embodiment of the invention, a method for integrating low Schottky barrier metal source/drain includes providing a substrate, forming an epitaxial SiGe layer outwardly from the substrate, forming an epitaxial Si layer outwardly from the SiGe layer, and forming a metal source and a metal drain.

Embodiments of the invention provide a number of technical advantages. Embodiments of the invention may include all, some, or none of these advantages. According to one embodiment, the conduction band offset of strained silicon reduces the Schottky barrier height between N inversion layer and metal silicide. For NMOS, where highly strained silicon and ErSi is used, zero barrier height may be formed. For PMOS, with a thin strained silicon layer, the holes like to conduct in the SiGe layer, which has a valence band offset and reduces the barrier height between the P inversion layer and metal silicide. If PtSi is used, then the barrier height may be reduced to zero. Such integration schemes allows the full metal source/drain MOSFETs to be fabricated with readily available metal silicides.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1 through 5B of the drawings, in which like numerals refer to like parts.

Figure 1:
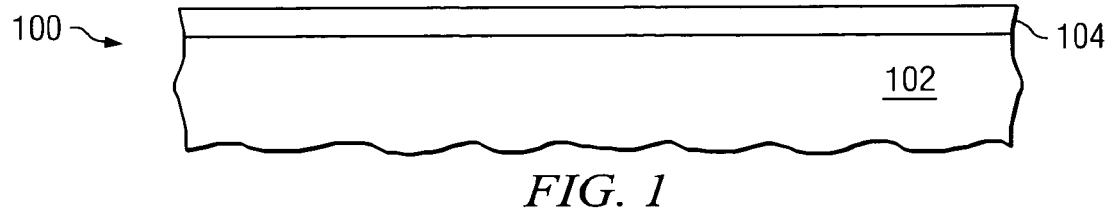
FIGS. 1 and 2 are a series of cross-sectional views illustrating various manufacturing stages of a partially-completed MOSFET in accordance with some embodiments of the present invention.
Figure 2:
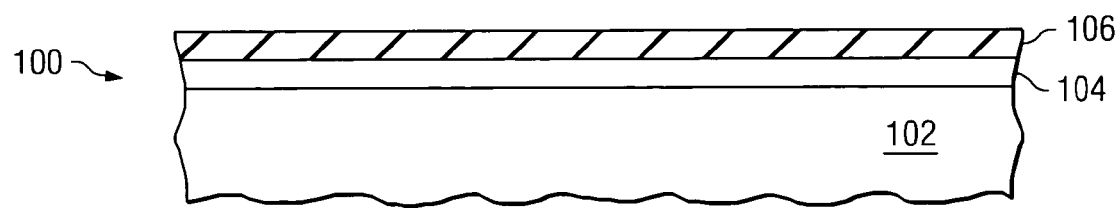

FIGS. 1 and 2 are a series of cross-sectional views illustrating various manufacturing stages of a partially-completed MOSFET 100 in accordance with some embodiments of the present invention. MOSFET 100, as used throughout this detailed description, represents a partially-completed MOSFET integrated in a CMOS device, such as an NMOS, PMOS, or other suitable semiconductor device. In the embodiment illustrated in FIGS. 1 and 2, MOSFET 100 includes a substrate 102, a silicon germanium ("SiGe") layer 104 formed outwardly from substrate 102, and a silicon layer 106 formed outwardly from the SiGe layer 104.

Substrate 102 may be formed from any suitable semiconductor materials, such as silicon and germanium and may have any suitable crystal orientation. The present invention is particularly suitable for substrate 102 being formed of a semiconductor on insulation ("SOI") system, such as silicon dioxide ("SiO$_2$"). In addition, a layer transfer technique, such as that outlined in U.S. Pat. No. 5,374,564, may be utilized to create a SiGe on insulator structure, which may be utilized to form substrate 102.

SiGe layer 104, in one embodiment, is an epitaxial SiGe layer formed using any suitable growth technique used in semiconductor processing and may have any suitable thickness. One function of an epitaxial SiGe layer is to increase the compressive stress within the channel of the completed transistor, which aids in hole mobility for MOSFET 100. The SiGe layer 104 relaxes into the particular crystal structure that substrate 102 possesses. In one embodiment, the percent fraction of germanium in SiGe layer 104 is approximately thirty percent; however, other suitable percent fractions may also be utilized.

Silicon layer 106, in one embodiment, is an epitaxial silicon layer formed using any suitable growth technique used in semiconductor processing and may have any suitable thickness. Although silicon layer 106 may have any suitable thickness, in one embodiment, silicon layer 106 has a thickness of approximately 100 Å. When silicon layer 106 is grown over SiGe layer 104, the result is a strained silicon layer because the lattice structure of the epitaxial silicon is different from the lattice structure of the epitaxial SiGe. According to the teachings of some embodiments of the invention, the strained silicon layer 106 reduces the Schottky barrier height between the conduction band and the metal source/drain for an NMOS structure, as described in further detail below in conjunction with FIGS. 3A and 3B.

In addition, the SiGe layer 104 reduces the valance band barrier height between the conduction channel and the metal source/drain for a PMOS structure, as described in further detail below in conjunction with FIGS. 4A and 4B. In another embodiment of the invention, a layer of strained silicon-germanium (not illustrated) may be formed on top of SiGe layer 104 before silicon layer 106 is formed. In such an embodiment, the percentage of germanium may be any suitable percentage up to 100%. This may provide higher mobility and an even lower Schottky barrier height.

Figure 3A:
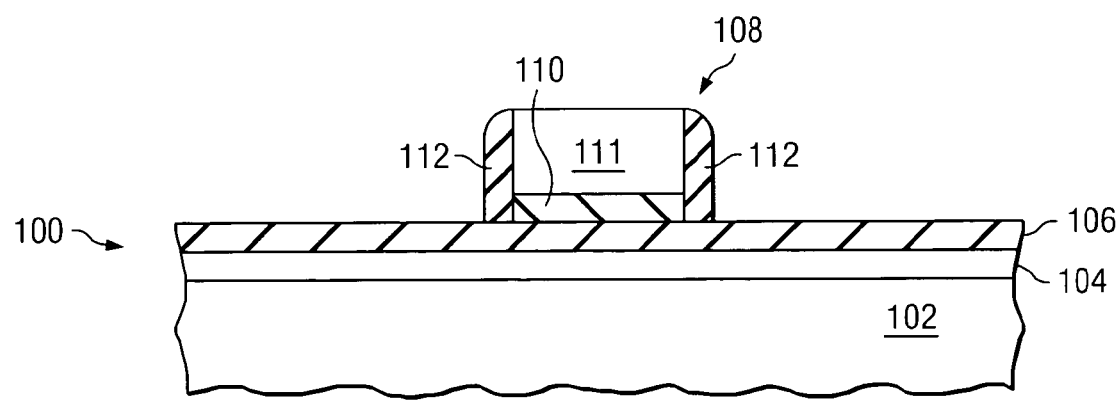
FIGS. 3A and 3B are a series of cross-sectional views illustrating various manufacturing stages of a partially-completed NMOS in accordance with one embodiment of the present invention.
Figure 3B:
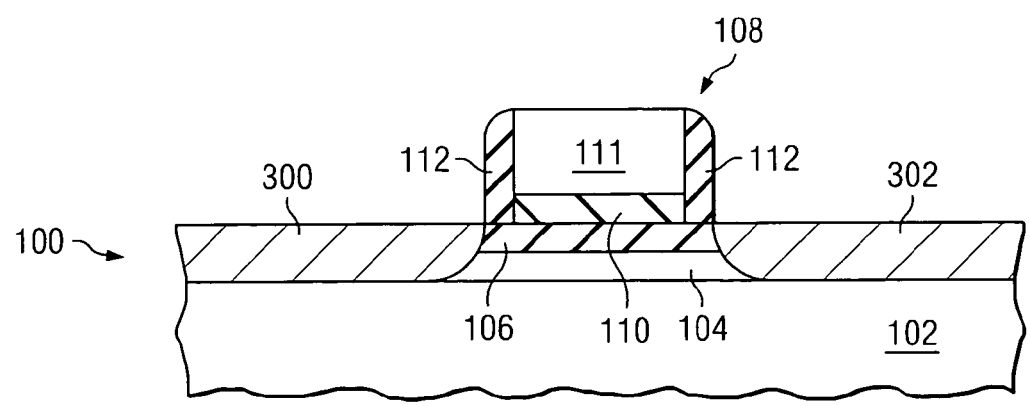

FIGS. 3A and 3B are a series of cross-sectional views illustrating various manufacturing stages of a partially-completed NMOS utilizing the partially-completed MOSFET 100 of FIGS. 1 and 2 according to one embodiment of the invention. As illustrated in FIG. 3A, a gate structure 108 has been formed outwardly from silicon layer 104. Gate structure 108 includes a gate 111, a gate oxide 110, and a pair of sidewalls 112. Each of these elements may be formed from any suitable material and may be formed using any suitable manufacturing techniques utilized in semiconductor processing. To complete the NMOS, a source and drain are formed, as indicated in FIG. 3B.

Referring to FIG. 3B, a metal source 300 and a metal drain 302 have been formed on either side of gate structure 108. Although any suitable metallic material may be utilized to form metal source 300 and metal drain 302, in a particular embodiment of the invention, an erbium silicide ("ErSi") is utilized. Utilizing such a metal silicide, in one embodiment, reduces the Schottky barrier down to zero or very close to zero. In such an NMOS structure, as illustrated in FIG. 3B, the electrons conduct through strained silicon layer 104.

Figure 4A:
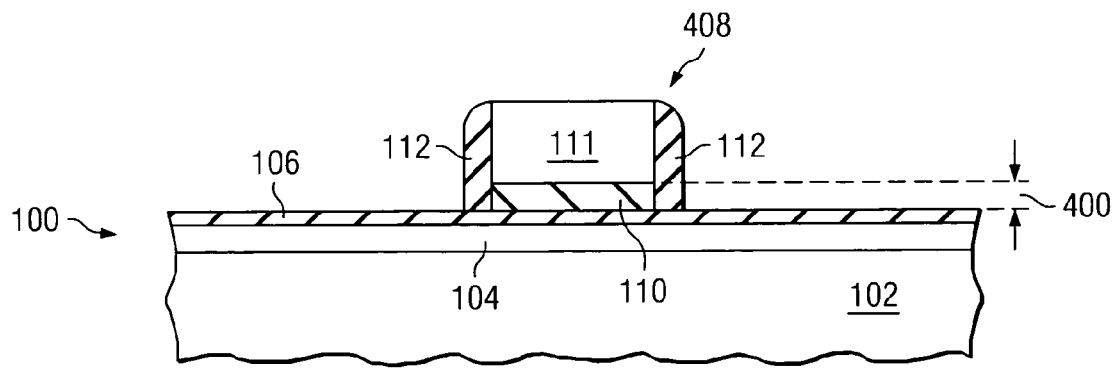
FIGS. 4A and 4B are a series of cross-sectional views illustrating various manufacturing stages of a partially-completed PMOS in accordance with one embodiment of the present invention.
Figure 4B:
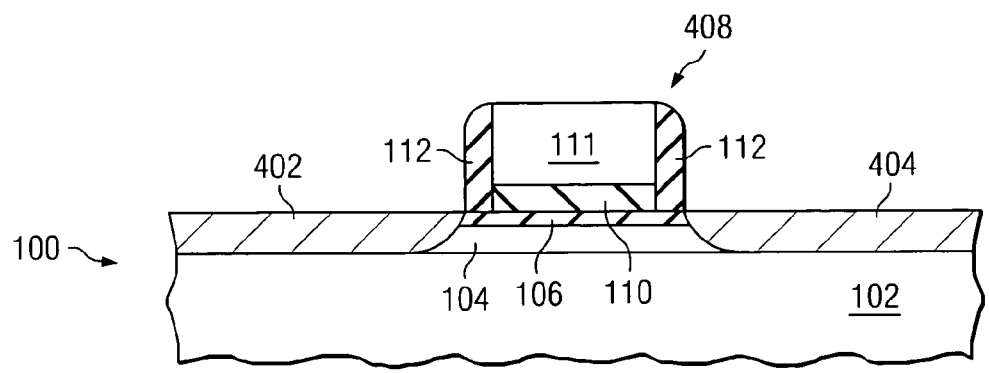

FIGS. 4A and 4B are a series of cross-sectional views illustrating various manufacturing stages of a partially-completed PMOS utilizing the partially-completed MOSFET 100 of FIGS. 1 and 2 in accordance with one embodiment of the present invention. For PMOS holes like to conduct in SiGe layer 104 due to higher mobility in SiGe and the lower source/drain-to-SiGe barrier height. Thus, localized thinning of strained silicon layer 106 may improve the PMOS gate control. Hence, referring to FIG. 4A, a portion 400 of silicon layer 106 is removed by any suitable removal technique. Although any suitable portion 400 of silicon layer 106 may be removed, in an embodiment where silicon layer 106 is approximately 100 Å thick, 70 Å to 80 Å is removed to thin silicon layer 106. Also illustrated in FIG. 4A is a gate structure 408 similar to gate structure 108 of FIG. 3A.

Referring to FIG. 4B, a metal source 402 and a metal drain 404 are formed on either side of gate structure 408. Although any suitable metallic material may be utilized to form metal source 402 and metal drain 404, in a particular embodiment of the invention, a platinum silicide ("PtSi") is utilized. Thus, for such a PMOS circuit as illustrated in FIGS. 4A and 4B, the valence band offset of the SiGe layer 104 reduces the metal source/drain to valence band barrier height down to zero or very close to zero.

Figure 5A:
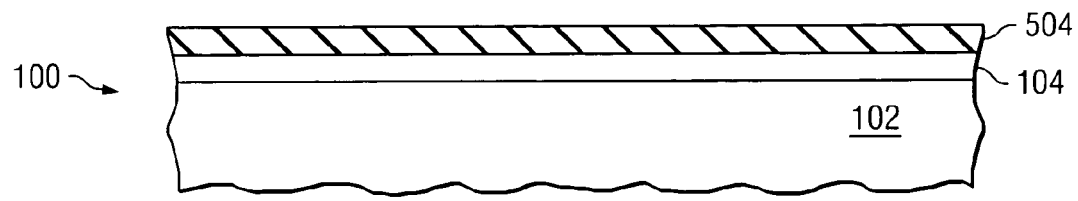
FIGS. 5A and 5B are a series of cross-sectional views illustrating various manufacturing stages of a partially-completed PMOS in accordance with another embodiment of the present invention.
Figure 5B:
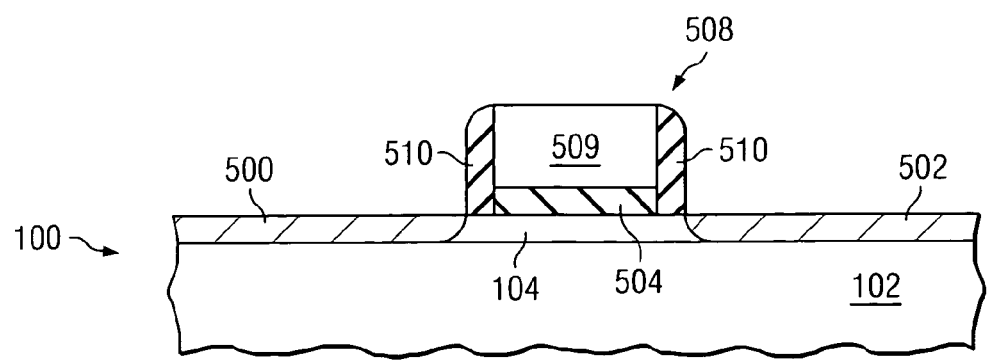

FIGS. 5A and 5B are a series of cross-sectional views illustrating various manufacturing stages of a partially-completed PMOS utilizing the partially-completed MOSFET 100 of FIGS. 1 and 2 in accordance with another embodiment of the invention. Referring to FIG. 5A, a high K gate dielectric 504 is formed outwardly from SiGe layer 104. High K, as used herein, means having a dielectric constant greater than that of silicon dioxide. In a particular embodiment of the invention, high K gate dielectric 504 is formed from hafnium silicate ("HfSiO"). In one embodiment, high K gate dielectric 504 is formed outwardly from SiGe layer 104 without forming silicon layer 106. In other embodiments, such as when a CMOS device is being fabricated, silicon layer 106 is formed outwardly from SiGe layer 104 then completely removed in the PMOS area of the device before forming the high K gate dielectric 504. High K gate dielectric 504 may be formed using any suitable deposition technique utilized in semiconductor processing.

Referring to FIG. 5B, a gate structure 508 is formed outwardly from substrate 102. A portion of the high K gate dielectric 504 functions as the gate dielectric for a gate 509 of gate structure 508. In addition, sidewalls 510 are formed in gate structure 508.

Also illustrated in FIG. 5B is a metal source 500 and a metal drain 502 formed on either side of gate structure 508. Although any suitable metallic material may be utilized to form metal source 500 and metal drain 502, in one embodiment, PtSi is utilized. Thus, the metal source/drain to valence band barrier height for the PMOS structure illustrated in FIGS. 5A and 5B may be reduced down to zero or very close to zero, thus making a metal source/drain workable.

Although embodiments of the invention and their advantages are described in detail, a person skilled in the art could make various alterations, additions, and omissions without departing from the spirit and scope of the present invention as defined by the appended claims.

What is claimed is:

1. A method for forming a CMOS, comprising:
providing a substrate having a PMOS region and an NMOS region;
forming an epitaxial SiGe layer outwardly from the substrate in the PMOS region and the NMOS region;
forming an epitaxial Si layer outwardly from the SiGe layer in the PMOS region and the NMOS region;
removing the epitaxial Si layer from the PMOS region, the epitaxial Si layer remaining in the NMOS region;
depositing a high K gate dielectric outwardly from the SiGe layer in the PMOS region;
depositing a gate dielectric outwardly from the epitaxial Si layer in the NMOS region;
forming gate structures in the PMOS region and the NMOS region; and
forming metal source and a metal drains in the PMOS region.

2. The method of claim 1, wherein providing a substrate comprises providing a SOI substrate.

3. The method of claim 1, wherein depositing a high K gate dielectric comprises depositing HfSiO outwardly from the SiGe layer.

4. The method of claim 1, wherein forming the metal source and the metal drain comprises forming both the metal source and the metal drain from PtSi.

5. A CMOS structure, comprising:
a substrate having a PMOS region and an NMOS region;
an epitaxial SiGe layer formed outwardly from the substrate in the PMOS region and the NMOS region;
an epitaxial Si layer formed outwardly from the SiGe layer in the NMOS region;
a first gate structure located in the NMOS region, the first gate structure including a first gate dielectric located on the epitaxial Si layer and a first gate electrode located on the first gate dielectric;
a second gate structure located in the PMOS region, the second gate structure including a second high K gate dielectric located on the epitaxial SiGe layer and a second gate electrode located on the second high K gate dielectric; and a first metal source and first metal drain located in the NMOS region and a second metal source and second metal drain located in the PMOS region.

6. The structure of claim 5 wherein the first metal source and metal drain include ErSi.

7. The structure of claim 5 wherein the second metal source and second metal drain include PtSi.

8. The structure of claim 5, wherein the substrate is an SOI substrate.

9. A method for forming a CMOS, comprising:
providing a substrate having a PMOS region and an NMOS region;
forming an epitaxial SiGe layer outwardly from the substrate in the PMOS region and the NMOS region;
forming an epitaxial Si layer outwardly from the SiGe layer in the PMOS region and the NMOS region;
reducing a thickness of the epitaxial Si layer in the PMOS region; and
forming a metal source and a metal drain in the PMOS region.

10. The method of claim 9, wherein providing a substrate comprises providing a SOI substrate.

11. The method of claim 9, wherein forming the epitaxial Si layer comprises forming an epitaxial Si layer having a depth of approximately 100 Å.

12. The method of claim 11, wherein reducing a thickness of the epitaxial Si layer comprises removing approximately 70 Å to 80 Å of the epitaxial Si layer.

13. The method of claim 9, wherein forming the metal source and the metal drain comprises forming both the metal source and the metal drain from PtSi.

* * * * *